Figure 1:
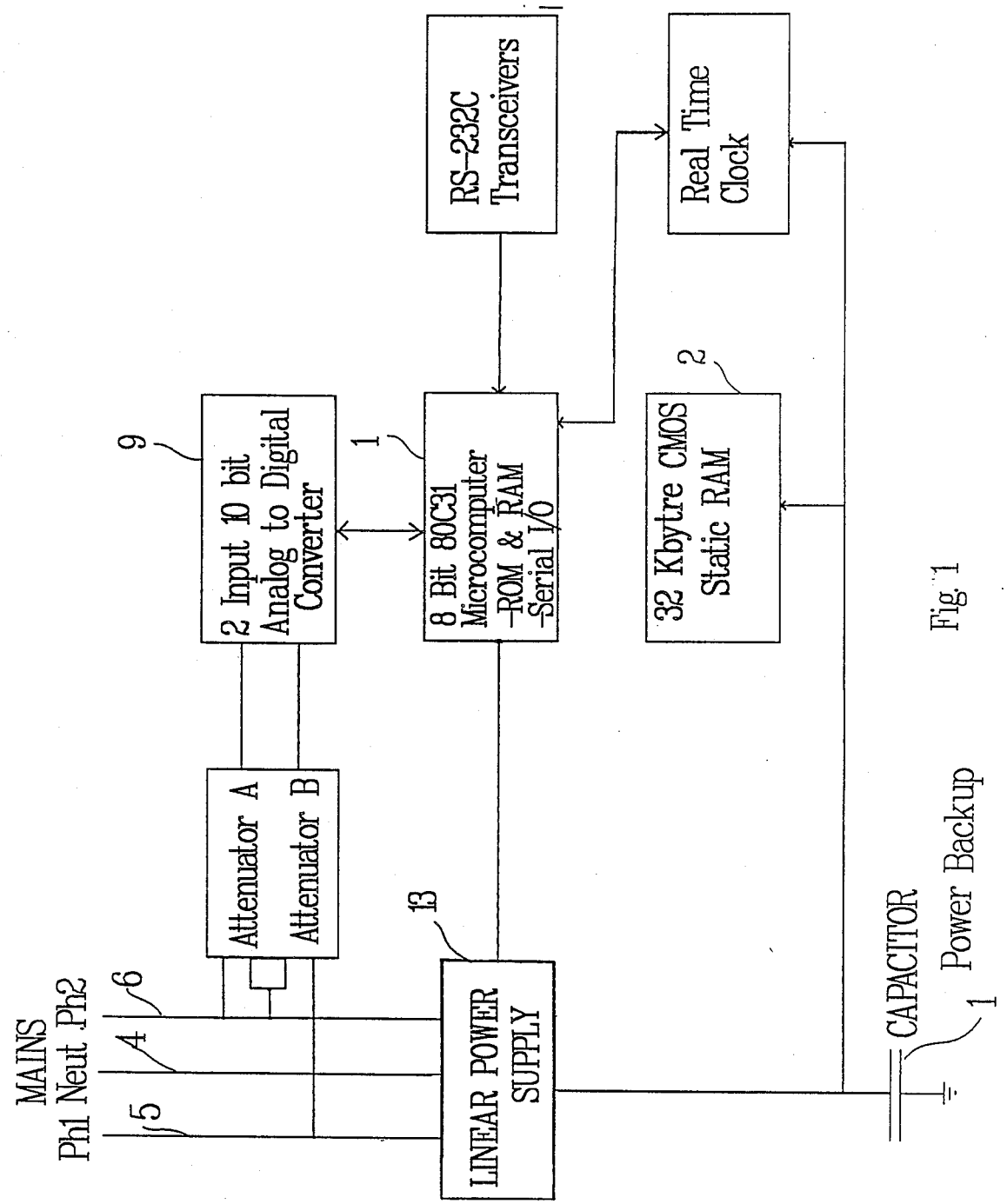

United States Patent [19]

Bishop

[11] Patent Number: 4,884,022
[45] Date of Patent: Nov. 28, 1989

[54] VOLTAGE TESTING DEVICE ATTACHABLE TO THE BLADE TERMINALS OF A POWER METER

[76] Inventor: Roy G. Bishop, 31 Donlea Drive, Port Colborne, Ontario, Canada, L3K 4W8

[21] Appl. No.: 198,212

[22] Filed: May 25, 1988

[30] Foreign Application Priority Data

May 28, 1987 [CA] Canada .................................. 538269

[51] Int. Cl.⁴ ...................... G01R 1/04; G01R 19/00; G08C 19/00
[52] U.S. Cl. .................................... 324/157; 324/111; 340/870.02
[58] Field of Search ................ 324/111, 103 P, 157, 324/156; 364/483; 340/518, 870.02; 379/107

[56] References Cited

U.S. PATENT DOCUMENTS

| | | | |
|---|---|---|---|
| 3,067,362 | 12/1962 | Patton | 324/156 |
| 4,082,999 | 4/1978 | Staker | 324/156 |
| 4,484,290 | 11/1984 | Bagnall et al. | 364/483 |
| 4,558,275 | 12/1985 | Borowy et al. | 324/103 P |
| 4,672,555 | 6/1987 | Hart et al. | 364/483 |

Primary Examiner—Ernest F. Karlsen
Attorney, Agent, or Firm—Fleit, Jacobson, Cohn, Price, Holman & Stern

[57] ABSTRACT

A voltage monitoring device is adapted to fit within or be mounted externally of the housing of a standard electricity meter. The device repeatedly monitors the voltage of the mains supply, stores data derived from the measurements for consecutive predetermined periods, and releases the stored data upon request.

9 Claims, 2 Drawing Sheets

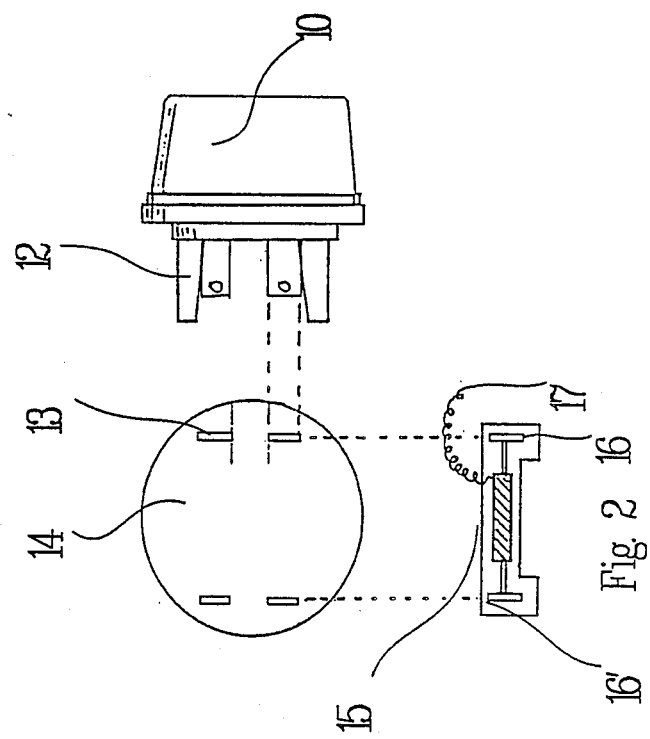

VOLTAGE TESTING DEVICE ATTACHABLE TO THE BLADE TERMINALS OF A POWER METER

The invention relates to a voltage monitoring device, particularly adapted for monitoring the mains voltage supply at customer premises.

Electricity utilities currently monitor mains voltage at certain points in the distribution system, but there is no easy and economical means of monitoring mains voltage at customer premises. This information is useful to give the utility companies the load management information they need to plan their distribution and supply systems.

An object of this invention is to provide a device capable of economically monitoring voltage supply at customer premises.

According to the present invention there is provided a voltage monitoring device, said device being adapted to fit within, or be mounted externally of the housing of a standard electricity meter and comprising means for repeatedly monitoring the voltage of the mains supply, means for storing data derived from said measurements for consecutive predetermined periods, and means for releasing the stored data upon request.

In a preferred embodiment, the data stored for each predetermined period, which may be five minutes in duration, are the high, low and mean voltages. The voltage measurements are preferably digitized and fed to a four-bit micro computer. The derived data are then stored in a thirty-two kilobyte CMOS static RAM.

The device can be provided with an RS-232 interface and associated link for connection to a commercial personal computer upon removal from the meter housing.

The invention will now be described in more detail, by way of example only, with reference to the accompanying drawings, in which:

FIG. 1 is a block diagram of a voltage monitoring device in accordance with the invention; and FIG. 2 illustrates the method of monitoring the device is mounted on a meter.

The voltage monitoring device shown in the Figure comprises a four-bit microcomputer with clock 1 associated with the 32 kilobyte CMOS static RAM 2. The unit is driven by a power supply 3 derived from the 3-terminal mains input consisting of a neutral line 4 and two live lines 6. The power supply 3 is also connected to a back-up capacitor 7 that is capable of providing power over an extended period of time to prevent loss of data in the event of a power failure.

The three mains supply terminals 4,5,6 are connected to a voltage sensing device 8, which in turn is connected to an analog-to-digital converter 9.

The output of the 4-bit microcomputer is connected by via a serial link to an RS-232 interface capable of communicating with a host computer, such as a standard IBM PC.

The device is designed to be installed as a retrofit unit either within or externally of the housing of a standard type plug-in domestic electricity meter. The device is connected to the three main supply terminals and in operation the voltage sensor 8 continuously monitors the voltage of each live line. Voltage measurements are normally made 60 times per second. The measurements are converted to digital form in A to D converter 9 and the microcomputer 1 derives from the voltage measurements the high, low and mean voltage as well as the number of missing pulses for each five-minute interval. There thus four readings per five-minute interval, 48 readings per hour, 672 readings per day or 20,160 readings per month. These readings are stored in the 32 kilobyte non-volatile static RAM 2. The microcomputer 1 is shown as the four-bit microcomputer, but can be an eight-bit microcomputer.

After one month has elapsed, the device can be removed from the meter base and returned to the central station where the data is transferred to a commercial PC via the RS-232 link. The device can be equipped with a radio transmitter and receiver, or some other form of remote communications device, if desired for establishing communication with a remote station.

While the power is normally derived from the mains supply, data integrity is maintained by the super capacitor 7 in the event of power failure.

FIG. 2 shows how the voltage monitoring device can be mounted on a standard meter. In FIG. 2, a standard residential kilowatt/hr meter 10 has four protruding blades 12 that fit into corresponding slots 13 in a standard meter base 14. The voltage monitoring device is built on a bridge type platform 15 with two spaced slots 16, 16' designed to fit over a pair of protruding blades 12 of the meter 10. The bridge 15 mounts the electronic components described with reference to FIG. 1. The device can also have a floating plug-in neutral wire 17 for connection to the neutral line running through the meter.

The slot 16,16' is equipped with metallic contacts that brush against the protruding meter blades to establish contact with those legs and supply current to the monitoring device.

The physical construction described with reference to FIG. 2 has the important advantage that it can be quickly and easily slipped over an existing meter. No physical modification of the meter is required.

The device, which is normally in the form of a single solid state module, can be easily placed inside an existing utility meter, or in the alternative a meter base, by a utility staff member. In this way, a utility can easily monitor line voltage at customer premises in any selected area. The device can easily be transferred from one customer to another when voltage monitoring is no longer considered necessary. At a central the data can be easily manipulated to show underlying patterns and line voltage variations in areas served by the utility.

The embodiments of the invention in which an exclusive property or privilege is claimed are defined as follows:

1. A voltage monitoring device for use with a standard plug-in type electricity meter having a meter housing with protruding blades fitting into corresponding slots in a meter base, said monitoring device comprising:
    a bridge member provided with a pair of spaced slots such that said bridge member can be fitted over a pair of said protruding blades and extend therebetween, said slots being provided with metal contacts to establish contact with said blades, and
    electronic circuitry carried by said bridge member, said electronic circuitry being connected to said metal contacts and included means for repeatedly monitoring the voltage of the mains supply, means for storing selected data derived from said measurements for consecutive predetermined periods and means for releasing the stored data upon request.

2. A device as claimed in claim 1, wherein the mean voltage is stored for each predetermined period.

3. A device as claimed in claim 2, wherein the high and low voltages are stored for each predetermined period.

4. A device as claimed in claim 1, comprising an analog-to-digital connector for digitizing the measured voltage, a microprocessor for deriving said data, and a digital memory for storing said data.

5. A device as claimed in claim 4, wherein said memory comprises a CMOS static RAM.

6. A device as claimed in claim 1, wherein said data releasing means comprises an RS-232 interface.

7. A device as claimed in claim 1, wherein said bridge member is adapted to fit over the protruding blades of the electricity meter, with the protruding blades passing through said slots in said bridge member and establishing contact with the metal contacts therein.

8. A voltage monitoring device for use with a standard plug-in type electricity meter having a meter housing with protruding blades fitting into corresponding slots in a meter base, said monitoring device comprising:
    a bridge member provided with a pair of spaced slots such that said bridge member can be fitted over a pair of the protruding blades and extend therebetween while the protuding blades engage corresponding slots in a meter base, said slots being provided with metal contacts to establish contact with the blades, and
    electronic circuitry carried by said bridge member, said electronic circuitry being connected to said metal contacts and including means for repeatedly monitoring the voltage of the mains supply, means for storing selected data derived from said measurements for consecutive predetermined periods and means for releasing the stored data upon request.

9. A device as claimed in claim 3, wherein said bridge member is adapted to fit over the protruding blades of the electricity meter with the protruding blades passing through the slots in said bridge member and establishing contact with the metal contacts therein.

* * * * *